US007660154B2

(12) United States Patent　　(10) Patent No.: US 7,660,154 B2
Wang　　(45) Date of Patent: Feb. 9, 2010

(54) LEVEL VERIFICATION AND ADJUSTMENT FOR MULTI-LEVEL CELL (MLC) NON-VOLATILE MEMORY (NVM)

(75) Inventor: Lee Wang, Diamond Bar, CA (US)

(73) Assignee: FlashSilicon, Incorporation, Diamond Bar, CA (US)

( * ) Notice: Subject to any disclaimer, the term of this patent is extended or adjusted under 35 U.S.C. 154(b) by 0 days.

(21) Appl. No.: 12/343,945

(22) Filed: Dec. 24, 2008

(65) Prior Publication Data

US 2009/0103361 A1　　Apr. 23, 2009

Related U.S. Application Data

(62) Division of application No. 11/744,811, filed on May 4, 2007.

(51) Int. Cl.
*G11C 16/00* (2006.01)
(52) U.S. Cl. .............................. 365/185.03; 365/185.05
(58) Field of Classification Search .................. 365/168
See application file for complete search history.

(56) References Cited

U.S. PATENT DOCUMENTS 5,592,001 A * 1/1997 Asano ........................ 257/316
5,751,635 A * 5/1998 Wong et al. ............. 365/185.19
5,764,568 A 6/1998 Chevallier
5,847,993 A * 12/1998 Dejenfelt .................. 365/185.1
6,556,475 B2 * 4/2003 Yamazaki et al. ....... 365/185.03
6,985,376 B2 * 1/2006 Matsuoka ................... 365/148

* cited by examiner

*Primary Examiner*—Tan T. Nguyen
(74) *Attorney, Agent, or Firm*—Haynes and Boone, LLP

(57) ABSTRACT

Non-Volatile Memory (NVM) cells are connected in inverter configurations. The NVM inverter's Voltage Transfer Characteristics (VTC) is used to verify and adjust threshold voltage levels of a Multi-Level Cell (MLC) in an NVM. In one embodiment, the NVM cell is fast programmed to a specific threshold voltage level. The cell threshold level is then verified by applying a gate voltage corresponding to the selected threshold voltage to the NVM inverter. The output voltage of the NVM inverter in response to the applied level gate voltage is detected. When the output voltage of the NVM inverter is out of a predefined output voltage window for the selected threshold voltage level, a fine-tuning programming sequence is applied to the NVM cell until the threshold voltage of the NVM cell is inside the correspondent threshold voltage window. This verification and adjustment scheme for a MLC NVM allows the threshold voltage of the multi-level NVM cells for any specific level to be controlled to a desired accuracy.

20 Claims, 7 Drawing Sheets

US 7,660,154 B2

LEVEL VERIFICATION AND ADJUSTMENT FOR MULTI-LEVEL CELL (MLC) NON-VOLATILE MEMORY (NVM)

CROSS-REFERENCE TO RELATED APPLICATIONS

This application is a divisional of U.S. patent application Ser. No. 11/744,811 filed May 4, 2007, entitled "Level Verification and Adjustment for Multi-Level Cell (MLC) Non-Volatile Memory (NVM),".

FIELD OF INVENTION

This invention relates to structures and methods for verification and adjustment of the voltages stored on each Non-Volatile Memory (NVM) Multi-Level Cell (MLC) in an array of such cells to ensure that the stored voltage corresponding to a given value is within an acceptable range associated with the threshold voltage for that value.

BACKGROUND OF INVENTION

The application of flash memory as mass data storage has placed additional demands on the cost-per-bit of flash memories and the required total memory density in systems. Traditional NVMs, denoted as Single Level Cell (SLC), have a one-to-one relationship between memory density and number of memory cells. To meet the higher memory capacity required of today's flash memory and to reduce per bit cost, Multi-Level Cell (MLC) NVMs been proposed. Flash memories with two (2) bits per cell have been in production (M. Bauer et. al. and Tae-Sung Jung et. al.) for some time. For an n-bit per cell NVM, the number of threshold voltage levels associated with the voltages stored in the cell is given by $2^n$. For example, for two (2) bits per cell NVM, which can represent any one of four different values, the number of threshold voltage levels associated with the voltage stored in the cell is four (4). For a four (4) bit per cell NVM, where each cell can store any one of sixteen different values, the number of threshold voltage levels becomes sixteen (16), and so forth. Increasing the number of bits stored in a single NVM cell exponentially increases the required number of threshold voltage levels. This imposes a very challenging limitation on MLC NVM. The number of resolvable threshold voltage levels within a limited threshold voltage range of NVM cells becomes an important key issue for the improvement of the bit capacity per NVM cell.

In conventional MLC NVM, the threshold voltage levels of NVM cells are defined and stored in reference cells. The reference NVM cells are pre-programmed to defined threshold voltage levels. The bits stored in an NVM cells as an analog voltage level are then read out by comparing the responding current or voltage from the cell when turned on by the appropriate gate voltage with a current or voltage in a reference cell under the same biasing condition. Due to the non-uniformity of programming conditions and variations in the fabrication process used to fabricate NVM cells, the distribution of the actual threshold voltage level associated with a given value stored in cells of an NVM array hinders increasing the number of resolvable threshold voltage levels. Other factors such as the sense amplifier DC offset and changes in NVM devices with use compared with the less used reference devices also contribute to this limitation in the number of different values that can be stored in an NVM MLC.

To improve the programming accuracy for NVM threshold voltage levels, a verification circuit to verify the threshold voltages of programmed NVM cells is usually included. Comparing the responding current or voltage of a programmed NVM MLC with that of a reference cell pre-programmed to a threshold voltage level under the same biasing condition is the conventional verification scheme. However, the conventional scheme is also affected by the non-uniformity of the reference and memory cells and their write/erase history.

SUMMARY

In this invention, in contrast to the conventional reference cell scheme, an inverter type of NVM circuit is used to verify the threshold voltage levels of NVM cells. Based on the input/output characteristics of the NVM inverter, a verification circuit detects the threshold voltages of fast-programmed NVM cells for a given threshold voltage level. From the detection results of these NVM cells, a fine-tuning programming sequence is used to adjust the threshold voltages of NVM cells into a desired window for all threshold voltage levels.

In one embodiment of this invention, a fixed output voltage window of the NVM inverters is set to verify the output voltages of the NVM inverters by applying a level verification input voltage to the gates of NVM cells. When the output voltage of an NVM inverter is outside the voltage window, a level-tuning sequence is then applied to the NVM cell until the responding output voltage of the NVM inverter is within the window. In this way, the width of threshold voltage distribution for specific threshold voltage levels in an NVM array can be achieved to a desired fixed accuracy. Consequently, more threshold voltage levels can be designed to fit into the threshold voltage range leading to more bit capacity per single NVM cell.

This invention will be more fully understood in conjunction with the following detailed description taken together with the drawings.

DETAILED DESCRIPTION

Figure 1:
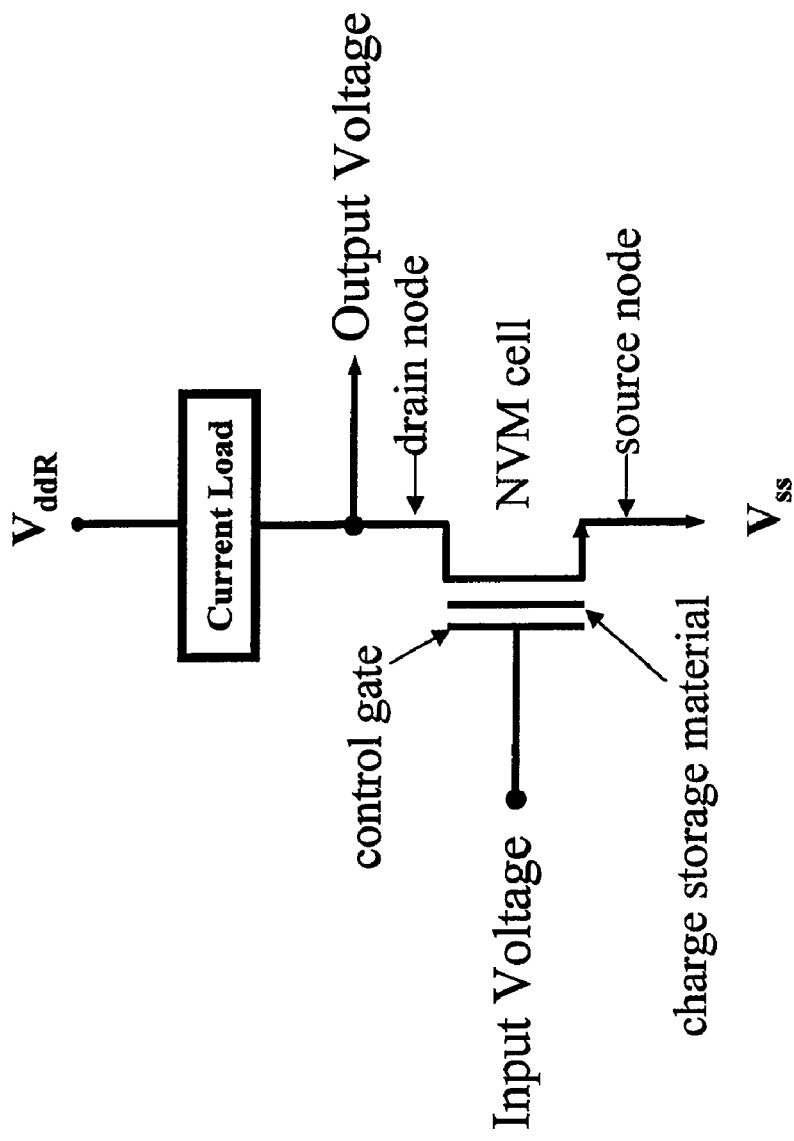
FIG. 1 shows the inverter schematic for N-type MOSFET NVM cell.
Figure 2:
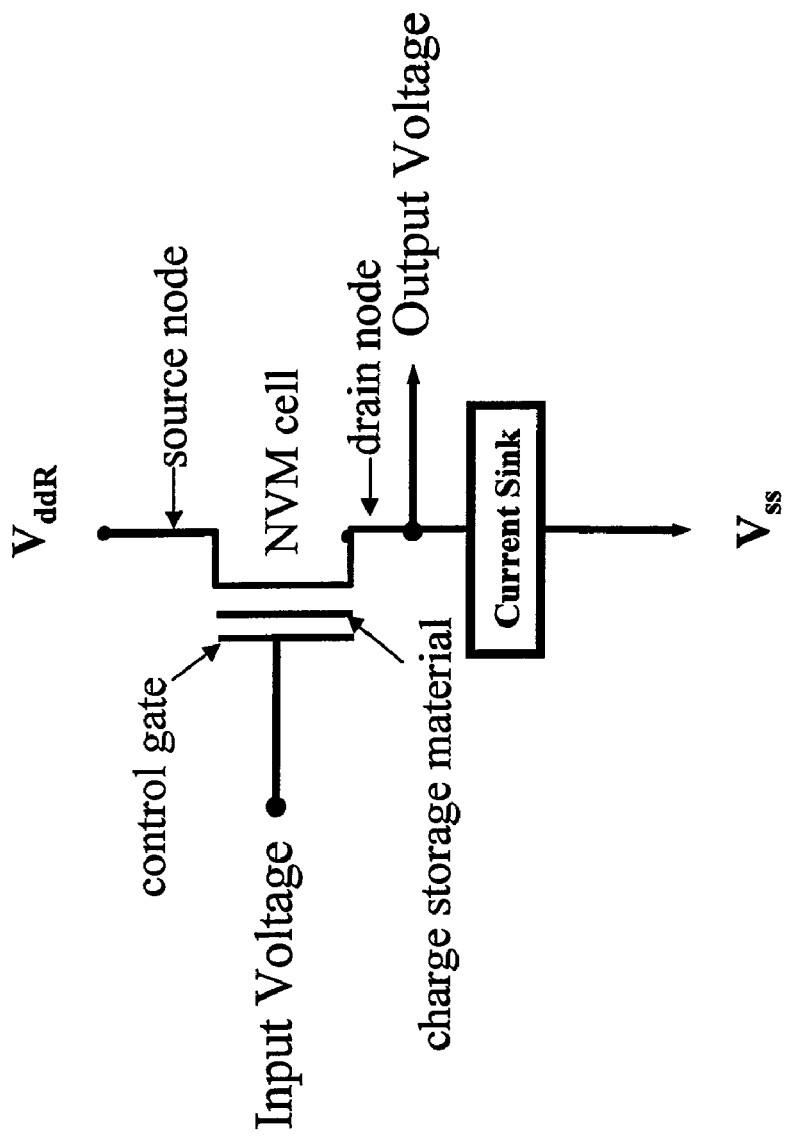
FIG. 2 shows the inverter schematic for P-type MOSFET NVM cell.
Figure 3:
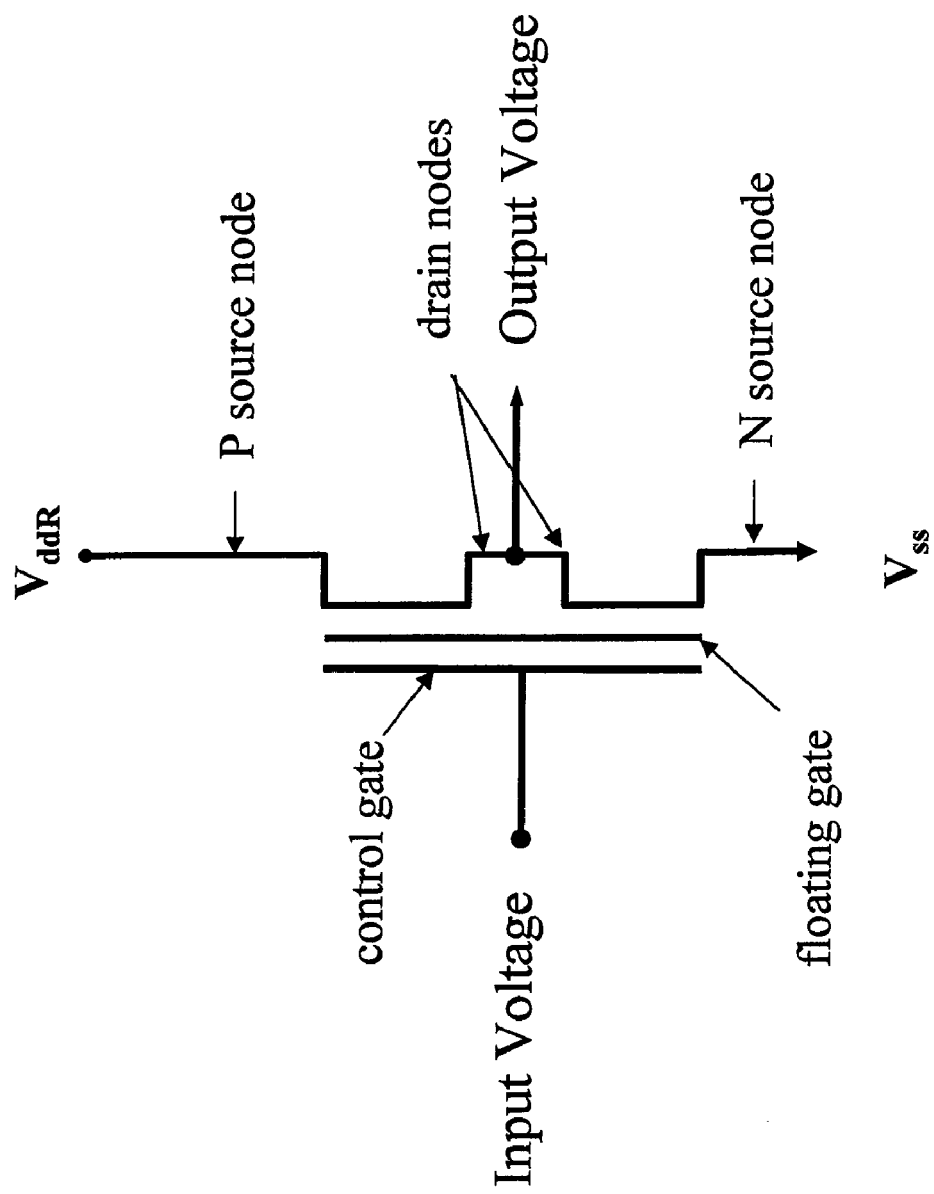
FIG. 3 shows the inverter schematic for Complementary MOSFET cell.
Figure 4:
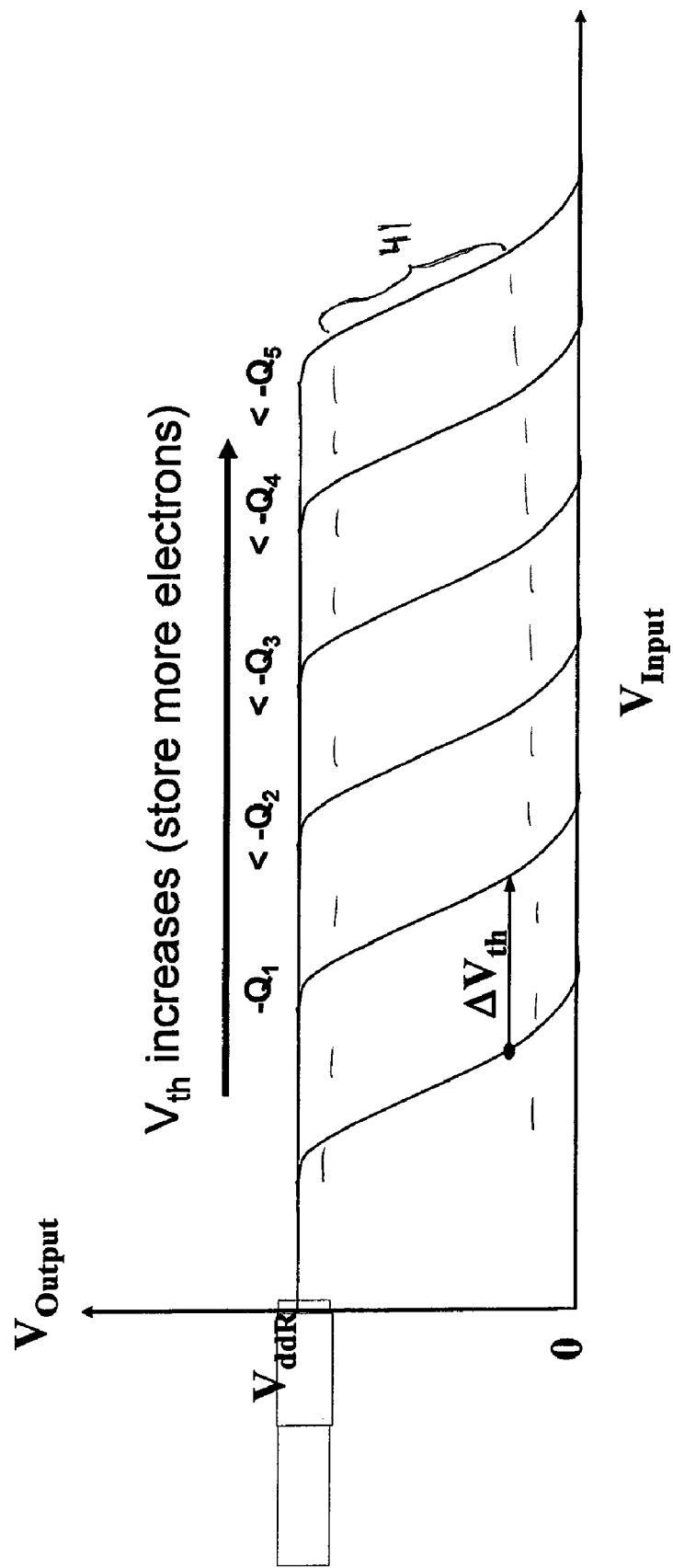
FIG. 4 shows a typical Voltage Transfer Characteristic (VTC) for an NVM inverter. The output voltage begins to invert from high voltage to low voltage at the NVM cell's threshold voltages. Parallel VTC curves manifest the threshold voltage shifts of the NVM cell. The slope of the parallel VTC curves in the inverting region is the inverter gain.

Inverter schematics are shown in FIG. 1, FIG. 2, and FIG. 3 for N-type MOSFET NVM, P-type MOSFET NVM, and Complementary MOSFET NVM, respectively. As shown in these schematics, the input voltages are applied to the control gates of the NVM cells and the output voltages are taken from the drain nodes of the NVM cells. The input/output voltage relationship for an inverter is characterized as the Voltage Transfer Characteristics (VTC) and is shown in FIG. 4 for a regular inverter. The VTC curves in FIG. 4 are displaced parallel along the input voltage axis to correspond to the threshold voltage shifts of each MLC in the NVM. As shown in FIG. 4, as the threshold voltage associated with an NVM MLC becomes higher (i.e. the MLC is storing more electrons or fewer holes), the VTC curve moves toward the right side, while for the threshold voltage of the NVM becoming lower (i.e. the MLC is storing fewer electrons or more holes) the VTC curves move toward the left side. Since the displacements of the voltage transfer characteristic as a function of the input voltage equal the threshold voltage shifts of the MLCs in the NVM, one can chose a constant voltage between the high read supply voltage $V_{ddR}$ and the low supply voltage $V_S$ (corresponding often to system ground), to be the universal reference voltage for the output voltages of all the NVM inverters. The applied input gate voltages for NVM cells with different threshold voltage levels responding at the output reference voltage are the input level gate voltages for the corresponding threshold voltage levels. Note that the difference between input level gate voltages is exactly the same as the corresponding threshold voltage level differences.

A set of discrete threshold voltage levels can be assigned to an n-bit word for representing n-bit storage of an NVM cell. An NVM cell is then fast programmed to a specific threshold voltage level for storing a specific bit-word. Ideally, the output voltage for the NVM cell, when the gate voltage corresponding to a given level or voltage value stored in the MLC of the NVM is applied to the control gate of the MLC, shall correspond to (i.e. be the same as) the reference voltage for that level gate voltage. However, due to variations in programming conditions and cell uniformities, the output voltages of the programmed NVM cells will not be exactly at the referencing voltage but vary around the reference voltage.

Figure 5:
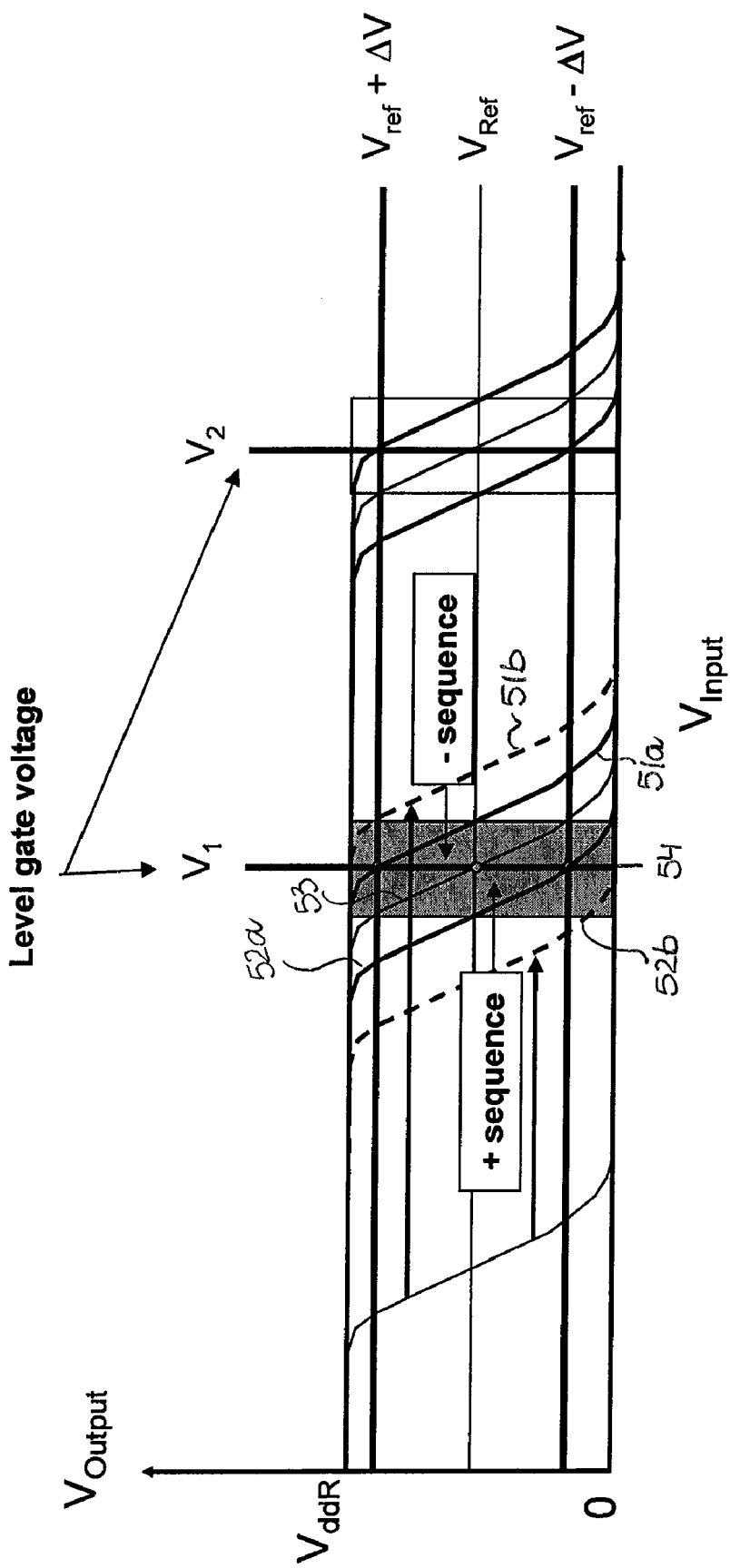
FIG. 5 shows structure for achieving a fixed threshold voltage window for all the threshold voltage levels. The output voltage of the NVM inverter at the gate voltage associated with a given stored value can be applied for verifying the threshold voltages of the NVM. Fine-tuning the programming sequence is applied to an NVM cell to adjust the threshold voltage associated with the value being stored to be in the threshold voltage window.

To control the variation of programmed NVM cells to a desired accuracy for a threshold voltage level, a verification-adjustment scheme is applied in accordance with this invention to verify the threshold voltage of each programmed NVM cell and to adjust the threshold voltage of each programmed NVM cell based on the output of the verification. In the present invention for the verification-adjustment scheme, a gate voltage corresponding to a given voltage level (corresponding, for example, to reference voltage 54 in FIG. 5) in the MLC cell is applied to the NVM inverters and a fixed output voltage window is set around the reference voltage 54 as depicted in FIG. 5. When the output voltage transfer characteristic of an NVM MLcell as shown by dashed line 51b in FIG. 5 is higher than the upper bound 51a of the referencing voltage window, the NVM cell has a higher threshold voltage than the upper bound 51a of the threshold voltage level. On the other hand, when the output voltage transfer characteristic 52b of an NVM cell is lower than the lower bound 52a of the referencing voltage window, the NVM MLC has a lower threshold voltage than the lower bound 52a of the threshold voltage level. According to the output voltages of the NVM inverters, a fine-tuning programming sequence is then applied to move the threshold voltages of the over-programmed NVM cells (higher threshold voltage) downward and the under-programmed NVM cells (lower threshold voltage) upward, respectively.

As depicted in FIG. 5, the relationship between the output voltage window and the threshold voltage window is simply given by $\Delta V_{output} = -\alpha \Delta V_{th}$, where $\alpha$ is the inverter gain at the level gate voltage. Since the inverter gain $\alpha$ is the same for all threshold voltage levels, the window for all threshold voltage levels is fixed with a given output voltage window. The load and the NVM MLcell's trans-conductance determine the inverter gain $-\alpha$.

Thus to resolve two distinct but directly adjacent threshold voltage levels requires that the level variations of the two directly adjacent but different threshold voltages be smaller than the separation of the two adjacent but different threshold voltage levels. In order to have more threshold voltage levels for higher bit per cell capacity, the fluctuations associated with a given threshold voltage level need to be controlled within a desired limit and certainly in any one direction to be less than half the separation between the two distinct but directly adjacent threshold voltages. The present invention provides methods and structures to achieve a controllable fixed threshold voltage level MLC NVM.

For simplicity, saturation transistor loads and an N-type NVM multi-level cell are employed as the detailed embodiment example. In the present configuration, numerous specific details are set forth in order to provide a thorough understanding of the present invention, and the scope of the present invention is expressly not limited except as specified in the accompanying claims. One skilled in the relevant art will recognize, however, that the invention may be practiced with variations on the specific details disclosed herein. Other embodiments with different types of current loads or variations on the NVM inverters shown herein will be recognized as being capable of being used but such variations or embodiments are not shown or described in order to avoid obscuring aspects of the invention.

Figure 6:
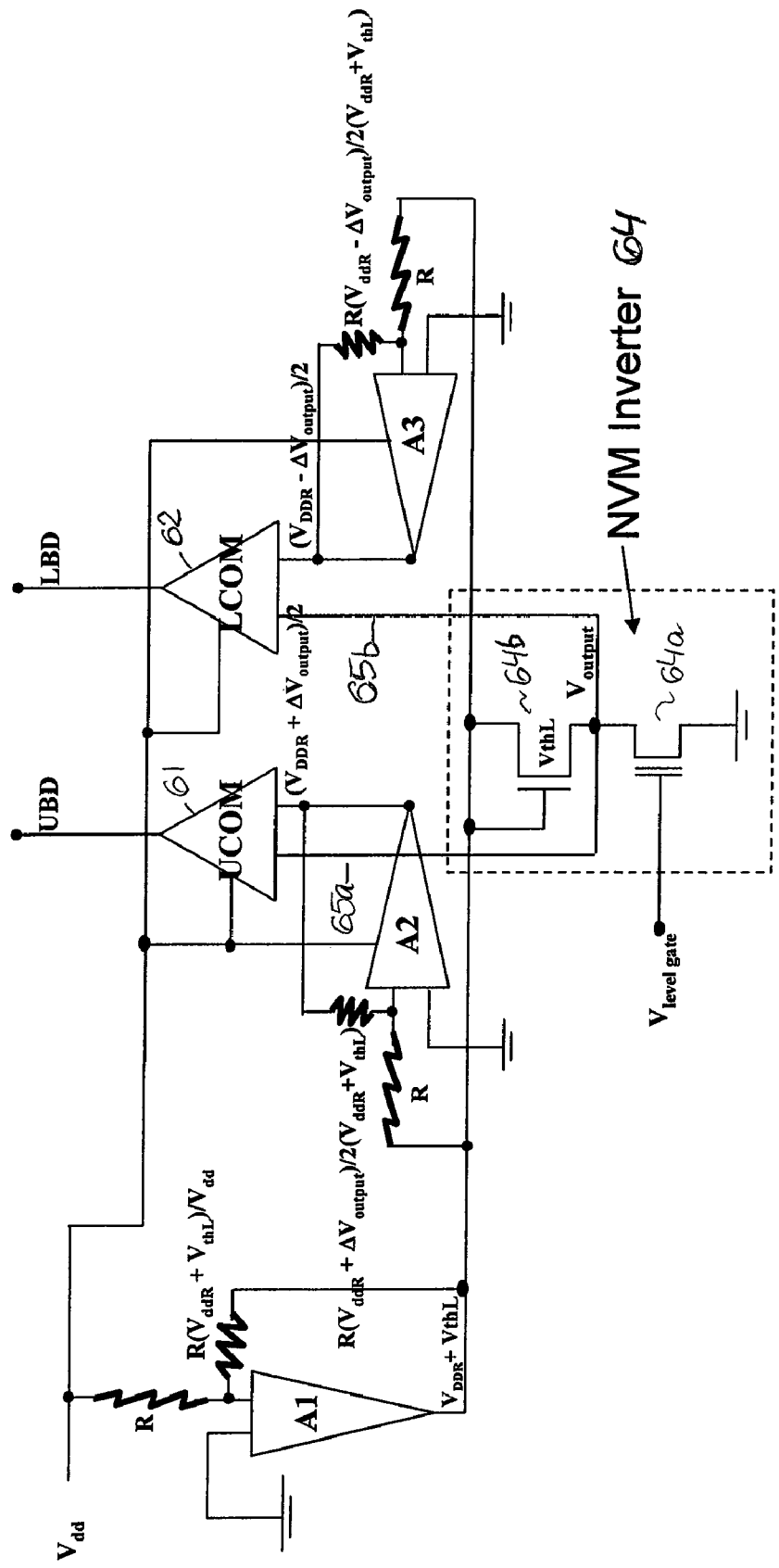
FIG. 6 shows embodiment schematics for a verification circuit.

The VTCs for an N-type saturation transistor load and an N-type NVM cell as shown in FIG. 6 is similar to those in FIG. 4. When the applied control gate voltage is below the NVM threshold voltage, $V_{thNVM}$, the NVM cell is in the cut-off mode. The output voltage for the cut-off NVM inverter is $V_{ddR} - V_{thL}$, where $V_{thL}$ is the threshold voltage of the N-type saturation transistor connected in series with the multi-level cell in the inverter between the multi-level cell and $V_{ddR}$ as shown in FIG. 6. When the applied gate voltage to the NVM cell is above the threshold, the NVM cell begins to turn on and the current in the NVM inverter increases as the gate voltage increases. In the meantime, the output voltage (the drain node of the NVM device) switches from "high" ($V_{dd} - V_{thL}$) to "low" ($V_{SS} = 0$). The slope of the VTC curve in the inverting region (defined as the inverter gain, $\alpha$) is given by the negative of the square root of $(k_n/k_L)$, where $k_n$ and $k_L$ are proportional to electron mobility times the width-length ratio of the ML cell and load transistor mobility times the width-length ratio of the load transistor, respectively. To obtain a steeper slope (larger inverter gain), one can increase the $k_n/k_L$ ratio. Usually this can be easily achieved by adjusting the load transistor width-length ratio. The reference voltage for the comparator can be chosen in the constant gain region 41 of the VTCs (linear inverting region) as shown in FIG. 4.

As shown in FIG. 4, for a higher threshold voltage NVM (storing more electrons), the VTC curves moves toward the right side, while for a lower threshold voltage NVM (storing less electrons) the VTC curves move toward the left side.

Each threshold voltage level of the NVM multi-level cells must fall between a minimum and maximum threshold voltage (See in FIG. 5 the minimum and maximum VTC curves 52a and 51a, respectively, associated with VTC curve 53 which in turn is associated with threshold voltage 54. Since the displacements of the VTC as a function of the input voltage equal the threshold voltage shifts of the NVM MLCs, a constant voltages between the high read supply voltage $V_{ddR}$ and the low supply voltage $V_{SS}=0$ can be chosen to be the reference voltage for the output voltages of NVM inverters at different threshold voltage levels. The applied input gate voltages to the inverters including the MLCs for different threshold voltage levels responding with this output reference voltage are defined as the input level gate voltages for different threshold voltage levels. As shown by the voltage transfer characteristic curves of FIG. 4, the differences between input level gate voltages are exactly the same as the corresponding threshold voltage level differences.

To achieve a controllable fixed threshold voltage window for all threshold voltage levels, we impose an output voltage window $\Delta V_{output}$ around the reference voltage $V_{ref}$. The relation between output voltage window and threshold voltage window is given by $\Delta V_{output}=-\alpha \Delta V_{th}$, where $\alpha$ is the inverter gain at the level gate voltage. In one embodiment we have $\alpha=-1$ with $(k_n/k_L)=1$. With these values for $\alpha$ and for $k_n/k_L$, the threshold voltage window for the threshold voltage levels equals the output voltage window.

FIG. 6 shows the verification circuit schematic of one embodiment. The output reference voltage is chosen at ½ $V_{ddR}$. The upper bound and lower bound output voltages are given by ½ ($V_{ddR}+\Delta V_{output}$) and ½ ($V_{ddR}-\Delta V_{output}$), respectively. The resistor ratio, that is, $(V_{ddR}+V_{thL})/V_{dd}$, in the first voltage divider A1 is chosen such that the output voltage of the NVM inverter is $V_{ddR}$, when the NVM cell is off. The resistor ratios, that is, $(V_{ddR}+\Delta V_{output})/2(V_{ddR}+V_{thL})$ and $((V_{ddR}-\Delta V_{output})/2(V_{ddR}+V_{thL})$, in voltage dividers A2 and A3 are chosen such that the output voltages of A2 and A3 are the upper bound voltage ½ ($V_{ddR}+\Delta V_{output}$) and the lower bound voltage ½ ($V_{ddR}-\Delta V_{output}$) respectively. The upper bound voltage ½ ($V_{ddR}+\Delta V_{output}$) and the lower bound voltage ½ ($V_{ddR}-\Delta V_{output}$) are fed into upper bound comparator UCOM 61 and lower bound comparator LCOM 62, respectively. The output voltage $V_{output}$ of the NVM inverter 64 is then fed simultaneously on leads 65a and 65b, respectively, to comparators UCOM and LCOM. When the output voltage of the NVM inverter is higher than the upper bound voltage ½ ($V_{ddR}+\Delta V_{output}$), the output signal UBD from comparator UCOM 61 will show a "high" state. While the output voltage of the NVM inverter 64 is lower than the lower bound voltage ½ ($V_{ddR}-\Delta V_{ouput}$) the output signal LBD of LCOM 62 will show a "high" state.

Inverter 64 in FIG. 6 includes an N type multi-level cell 64a connected in series between system ground and an N channel saturated transistor 64b with a threshold voltage $V_{thL}$. The drain and gate of transistor 64b are connected to the supply voltage $V_{ddR}$ through voltage divider A1.

Figure 7:
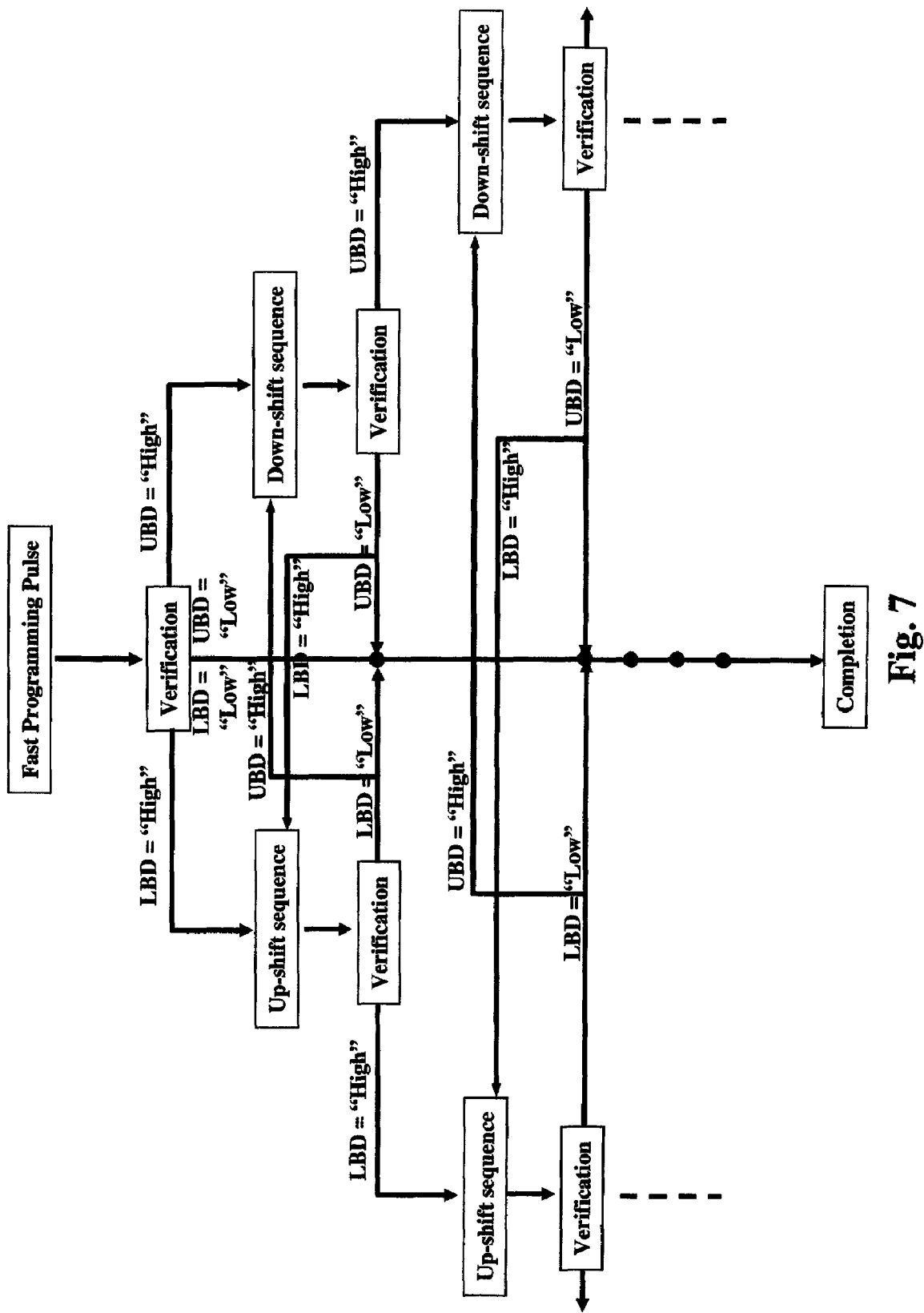
FIG. 7 shows embodiment programming sequence to achieve a fixed threshold voltage window of MLC NVM.

The programming sequence for a controllable fixed threshold voltage is illustrated in FIG. 7. First, a fast programming pulse is applied to the NVM cell from an erased state to a specific threshold voltage level according to the bit-word to be stored. This pulse results in electrons being stored on the NVM cell thereby changing the threshold voltage of the cell. Second, the desired threshold voltage of the NVM cell is verified by applying to the gate of the NVM cell the gate voltage corresponding to the desired threshold voltage in the programmed cell. The signals UBD and LBD from comparators 61 and 62 (FIG. 6), respectively, are the verification circuit output signals. The "high" state of UBD indicates that the threshold voltage of the programmed NVM is higher than the upper bound of the threshold voltage level. Therefore, a negative fine-step programming sequence is applied to the NVM cell to shift the threshold voltage downward by removing charges from the NVM cell. The shift-down sequence will continue until the signal UBD from comparator 61 switches to a "low" state. The "high" state of signal LBD from comparator 62 indicates that the threshold voltage of the programmed NVM is lower than the lower bound of the threshold voltage level. Therefore, a positive fine-step programming sequence is applied to the NVM cell to shift the threshold voltage upward by adding charge to the NVM cell. The shift-up sequence will continue until the signal LBD from comparator 62 switches to a "low" state. When both UBD and LBD are in the "low" state, the threshold voltage of the programmed NVM is in the voltage window of the threshold voltage level. In one embodiment, the inverter gain is selected to be −1. The threshold voltage window for all threshold voltage levels is programmed to be +/−100 millivolts.

A verification and threshold voltage adjustment scheme for MLC NVM has been described based on an NVM using a plurality of multi-level cells each in an inverter configuration. The input/output voltage characteristics of each multi-level cell in the inverter configuration are then used to fine tune the electrons stored in the cell to the desired threshold voltage. A fixed threshold voltage window for all threshold levels can be achieved to a desired accuracy by the methods and structures in accordance with this invention.

For clarity of description of embodiments of this invention, well-known circuitry associated with MLCells in NVMs has not been shown. For example, circuitry for programming a transistor capable of holding charge by adding or removing charge from the transistor is known in the prior art and has not been shown. In addition, the load devices used in the inverters described herein can comprise not only resistors but also N-type saturated transistors, P-type saturated transistors, N-type depletion MOSFETs and P-type depletion MOSFETs.

Those of ordinary skill in the art will immediately realize that the embodiments of the present invention described herein in the context of methods and schematics are illustrative only and are not intended to be in any way limiting. Other embodiments of the present invention will readily suggest themselves to such skilled persons having the benefits of this disclosure.

What is claimed is:

1. Structure comprising:
   a multi-level cell for use in a nonvolatile memory, said cell including a transistor for storing charge representing any one of $2^n$ possible values, where n is a selected integer, said transistor comprising a drain, a source and a control gate;
   a load device connected in series with said transistor; and
   an output terminal connected between said transistor and said load device such that the output voltage on said output terminal assumes approximately the same value when the gate voltage on said transistor is sufficient to turn on said transistor, regardless of the charge stored on said transistor.

2. Structure as in claim 1 wherein said load device comprises a resistor.

3. Structure as in claim 1 wherein said load device comprises an N-type saturated MOS transistor.

4. Structure as in claim 1 wherein said load device comprises a P-type saturation MOS transistor.

5. Structure as in claim 1, wherein said load device comprises an N-type depletion MOS FET.

6. Structure as in claim 1, wherein said load device comprises a P-type depletion MOS FET.

7. Structure as in claim 1, wherein said transistor comprises an N-channel MOS FET and said load device comprises a device with an impedance, said load device being connected between the drain of said N channel MOS FET and a source of a supply voltage.

8. Structure as in claim 7, wherein said load device comprises a resistor.

9. Structure as in claim 7, wherein said load device comprises a saturated N-channel MOS transistor.

10. Structure as in claim 7, wherein said load device comprises a P-type saturated MOS FET.

11. Structure as in claim 7, wherein said load device comprises an N-type depletion MOS FET.

12. Structure as in claim 7, wherein said load device comprises a P-type depletion MOS FET.

13. Structure as in claim 7, wherein the source of said N-channel MOS FET device is connected to system ground.

14. Structure as in claim 1, wherein said transistor comprises a P-channel MOS FET, and said load device comprises a device with an impedance, said load device being connected between the drain of said P-channel MOS FET and the system ground.

15. Structure as in claim 14, wherein said load device comprises a resistor.

16. Structure as in claim 14, wherein said load device comprises a P-type saturated MOS transistor.

17. Structure as in claim 14, wherein said load device comprises an N-type saturated MOS transistor.

18. Structure as in claim 14, wherein said load device comprises an N-type depletion MOS FET.

19. Structure as in claim 14, wherein said load device comprises a P-type depletion MOS FET.

20. Structure as in claim 14, wherein the source of said P-channel MOS FET device is connected to a source of supply voltage.

* * * * *